(12) United States Patent
Pratt et al.

(10) Patent No.: US 8,218,703 B2
(45) Date of Patent: Jul. 10, 2012

(54) METHODS OF PROCESSING A WIRELESS COMMUNICATION SIGNAL, WIRELESS COMMUNICATION SYNCHRONIZATION METHODS, AND A RADIO FREQUENCY IDENTIFICATION DEVICE COMMUNICATION METHOD

(75) Inventors: Richard M. Pratt, Richland, WA (US); Steven B. Thompson, Richland, WA (US)

(73) Assignee: Battelle Memorial Institute, Richmond, WA (US)

( * ) Notice: Subject to any disclaimer, the term of this patent is extended or adjusted under 35 U.S.C. 154(b) by 305 days.

(21) Appl. No.: 12/630,764

(22) Filed: Dec. 3, 2009

(65) Prior Publication Data

US 2010/0142665 A1 Jun. 10, 2010

Related U.S. Application Data

(62) Division of application No. 10/263,670, filed on Oct. 2, 2002, now Pat. No. 7,760,835.

(51) Int. Cl.
*H04L 7/02* (2006.01)
*H04L 7/033* (2006.01)
*H04L 7/00* (2006.01)
*H04L 7/04* (2006.01)

(52) U.S. Cl. .......................... 375/360; 375/355; 375/361

(58) Field of Classification Search .................. 375/282, 375/333, 340, 354, 355, 360, 361; 341/70, 341/71; 329/315, 341, 343
See application file for complete search history.

(56) References Cited

U.S. PATENT DOCUMENTS

| 3,737,895 A | * | 6/1973 | Cupp et al. ................... 341/71 |
| 3,967,061 A | | 6/1976 | Dobias et al. |
| 4,075,632 A | | 2/1978 | Baldwin et al. |
| 4,167,760 A | * | 9/1979 | Decker ........................ 360/40 |
| 4,241,347 A | | 12/1980 | Albanese et al. |

(Continued)

FOREIGN PATENT DOCUMENTS

EP 0585132 A1 3/1994

(Continued)

OTHER PUBLICATIONS

U.S. Appl. No. 09/588,997, filed Jun. 6, 2000, Gilbert et al.

(Continued)

*Primary Examiner* — Betsy Deppe
(74) *Attorney, Agent, or Firm* — Wells St. John, PS

(57) ABSTRACT

In one aspect, a wireless communication device includes an antenna configured to receive electromagnetic energy corresponding to a wireless communication signal outputted using an interrogator and to output electrical energy corresponding to the received electromagnetic energy, communication circuitry coupled with the antenna and configured to sample the electrical energy to process the wireless communication signal, synchronization circuitry coupled with the antenna and the communication circuitry and configured to generate a clock signal to control sampling of the electrical energy using the communication circuitry, wherein the synchronization circuitry is configured to generate a plurality of transitions within the clock signal responsive to a plurality of transitions of the electrical energy during a first data period and wherein the synchronization circuitry is configured to generate a plurality of transitions within the clock signal during a second data period including generating at least one of the transitions independent of transitions of the electrical energy.

26 Claims, 5 Drawing Sheets

U.S. PATENT DOCUMENTS

| | | | |
|---|---|---|---|
| 4,352,183 A | | 9/1982 | Davis et al. |
| 4,360,810 A | | 11/1982 | Landt |
| 4,471,345 A | | 9/1984 | Barrett, Jr. |
| 4,547,764 A | * | 10/1985 | Levy-Navarro et al. ........ 341/71 |
| 4,746,898 A | * | 5/1988 | Loeppert ........................ 341/70 |
| 5,001,728 A | * | 3/1991 | Fuldner ........................ 375/328 |
| 5,371,737 A | | 12/1994 | Nelson et al. |
| 5,373,258 A | | 12/1994 | Gerot et al. |
| 5,465,268 A | * | 11/1995 | Rainbolt ....................... 375/333 |
| 5,530,702 A | | 6/1996 | Palmer et al. |
| 5,550,547 A | | 8/1996 | Chan et al. |
| 5,557,280 A | | 9/1996 | Marsh et al. |
| 5,583,819 A | | 12/1996 | Roesner et al. |
| 5,649,296 A | | 7/1997 | Mac Lellan et al. |
| 5,696,800 A | | 12/1997 | Berger |
| 5,699,066 A | | 12/1997 | Marsh et al. |
| 5,761,255 A | | 6/1998 | Shi |
| 5,850,187 A | | 12/1998 | Carrender et al. |
| 5,883,582 A | | 3/1999 | Bowers et al. |
| 5,905,759 A | | 5/1999 | Ishida et al. |
| 5,940,006 A | | 8/1999 | MacLellan et al. |
| 5,952,935 A | | 9/1999 | Mejia et al. |
| 5,986,570 A | | 11/1999 | Black et al. |
| 6,008,746 A | | 12/1999 | White |
| 6,064,705 A | | 5/2000 | Zalud et al. |
| 6,091,319 A | | 7/2000 | Black et al. |
| 6,130,623 A | | 10/2000 | MacLellan et al. |
| 6,177,861 B1 | | 1/2001 | MacLellan et al. |
| 6,236,315 B1 | | 5/2001 | Helms et al. |
| 6,265,962 B1 | | 7/2001 | Black et al. |
| 6,307,848 B1 | | 10/2001 | Wood, Jr. |
| 6,366,260 B1 | | 4/2002 | Carrender |
| 6,501,801 B2 | | 12/2002 | Chujoh et al. |
| 6,738,025 B2 | | 5/2004 | Carrender |
| 6,745,008 B1 | | 6/2004 | Gilbert et al. |
| 6,765,476 B2 | | 7/2004 | Gilbert et al. |
| 6,842,106 B2 | | 1/2005 | Hughes et al. |
| 6,856,658 B1 | | 2/2005 | Baba et al. |
| 6,868,073 B1 | | 3/2005 | Carrender et al. |
| 6,914,528 B2 | | 7/2005 | Pratt et al. |
| 6,944,424 B2 | | 9/2005 | Heinrich et al. |
| 6,995,652 B2 | | 2/2006 | Carrender et al. |
| 6,995,655 B2 | | 2/2006 | Ertin et al. |
| 7,009,495 B2 | | 3/2006 | Hughes et al. |
| 7,009,515 B2 | | 3/2006 | Carrender |
| 7,009,526 B2 | | 3/2006 | Hughes et al. |
| 7,019,617 B2 | | 3/2006 | Pratt et al. |
| 7,019,618 B2 | | 3/2006 | Pratt et al. |
| 2002/0037065 A1 | | 3/2002 | Nakamura |
| 2003/0053385 A1 | | 3/2003 | Tobita et al. |
| 2004/0066752 A1 | | 4/2004 | Hughes et al. |

FOREIGN PATENT DOCUMENTS

| | | |
|---|---|---|
| WO | WO 00/63830 | 10/2000 |
| WO | PCT/US2003/30209 | 2/2004 |
| WO | WO2005/088706 A1 | 9/2005 |

OTHER PUBLICATIONS

U.S. Appl. No. 09/589,001, filed Jun. 6, 2000, Gilbert et al.

Finkenzeller, Klaus, "Radio-Frequency identification Fundamentals and Applications", RFID Handbook, Jan. 2002; Chapter 8, pp. 151-158.

Part 2:Mechanisms Using Symmetry Encipherment Algorithms; Information Technology—Security Techniques—Entity Authenticat; #ISO/IEC 9798-2:1999(E), 2nd Ed., pp. 1-11; Jul. 15, 1999.

Agilent Technologies, "Schottky Diode Voltage Doubler, Application Note 956-4", 2 pages (1999).

A Novel Clock Recovery Circuit for Fully Monolithic Integration; Murata et al.; Jun. 1999; pp. 201-204.

* cited by examiner

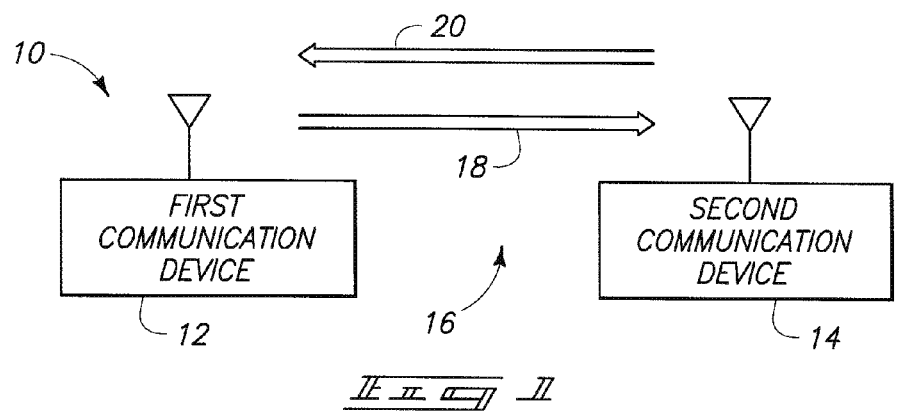
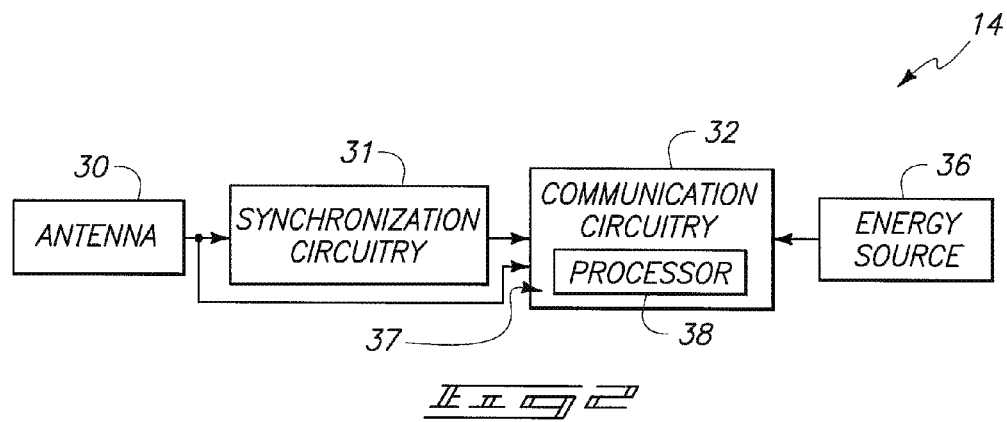

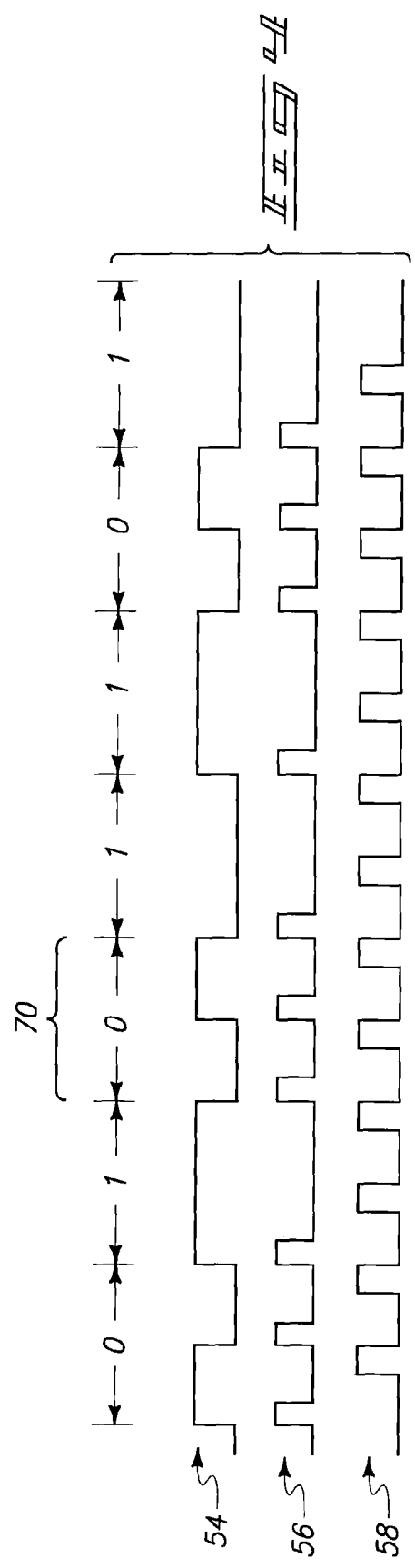

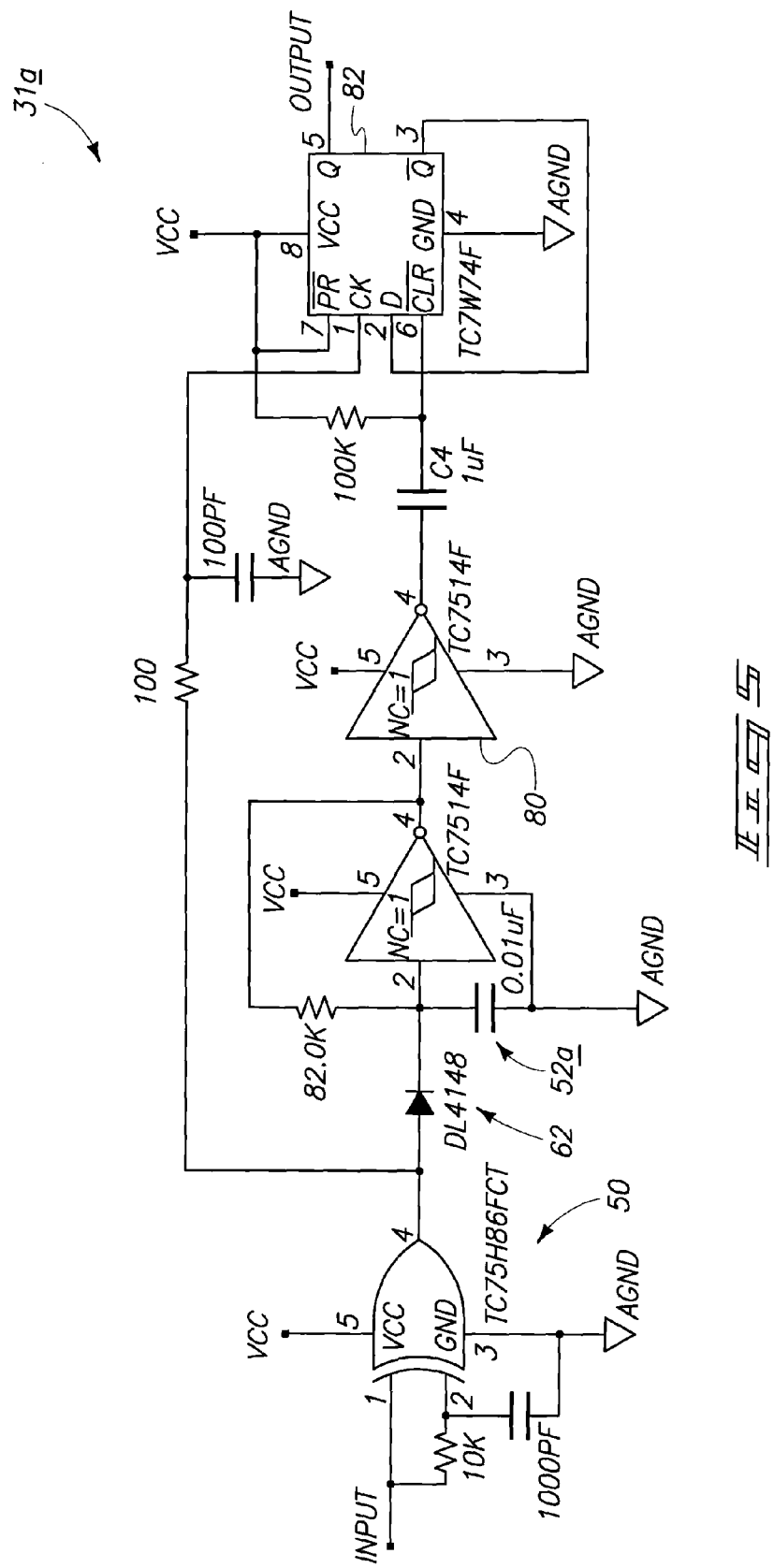

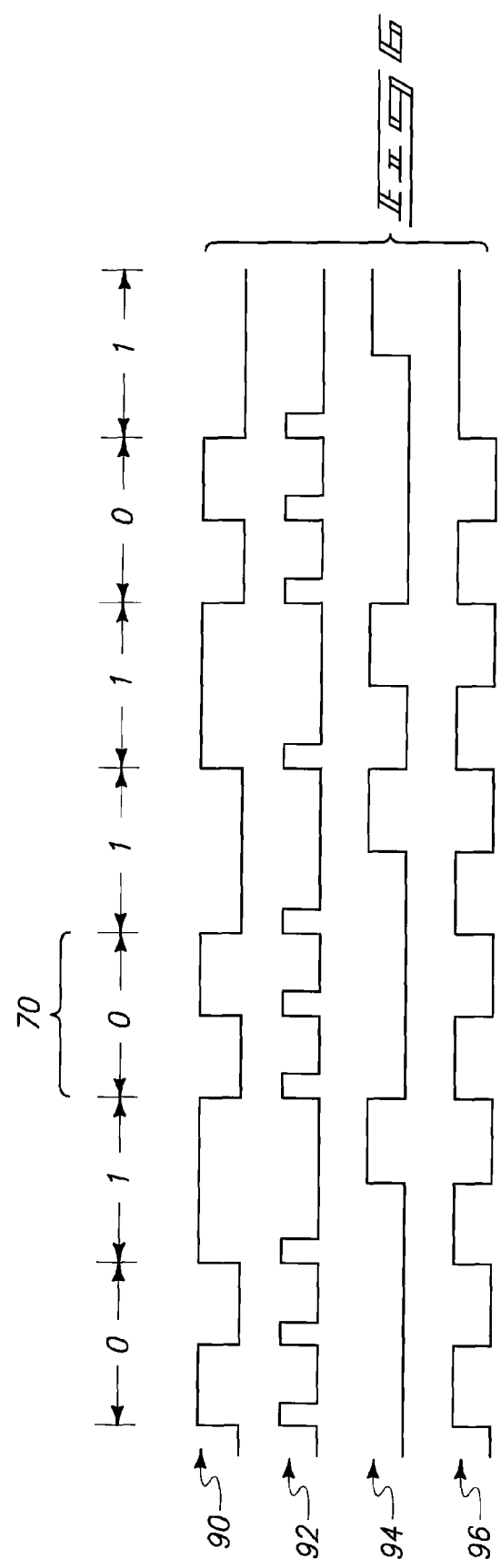

METHODS OF PROCESSING A WIRELESS COMMUNICATION SIGNAL, WIRELESS COMMUNICATION SYNCHRONIZATION METHODS, AND A RADIO FREQUENCY IDENTIFICATION DEVICE COMMUNICATION METHOD

CROSS REFERENCE TO RELATED APPLICATION

This application is a divisional of and claims priority to U.S. patent application Ser. No. 10/263,670 which was filed on Oct. 2, 2002 now U.S. Pat. No. 7,760,835, titled "Wireless Communications Devices, Methods Of Processing A Wireless Communication Signal, Wireless Communication Synchronization Methods And A Radio Frequency Identification Device Communication Method," listing Richard M. Pratt and Steven B. Thompson as inventors, and which is incorporated herein by reference.

GOVERNMENT RIGHS STATEMENT

This invention was made with Government support under Contract 43213A awarded by the U.S. Department of Navy. The Government has certain rights in the invention.

TECHNICAL FIELD

This invention relates to wireless communications devices, methods of processing a wireless communication signal, wireless communication synchronization methods and a radio frequency identification device communication method.

BACKGROUND OF THE INVENTION

Remote wireless communications may be implemented using radio frequency (RF) technology. Exemplary applications utilizing RF technology include identification applications including, for example, locating, identifying, and tracking of objects. Radio frequency identification device (RFID) systems may be utilized to facilitate identification operations. For example, one device may be arranged to output and receive radio frequency communications and one or more remotely located device may be configured to communicate with the one device using radio frequency communications. The remotely located device(s) may be referred to as a tag, while the other device may be referred to as a reader. Some advantages of radio frequency communications of exemplary radio frequency identification device systems include an ability to communicate without contact or line-of-sight, at relatively fast speeds, and with robust communication channels.

One problem which may be encountered while implementing wireless communications is synchronization of wireless communication devices. Proper synchronization provides efficient and robust transfer of data to be communicated. As described herein, exemplary aspects are disclosed to provide proper synchronization of wireless communications.

BRIEF DESCRIPTION OF THE DRAWINGS

Preferred embodiments of the invention are described below with reference to the following accompanying drawings.

FIG. 1 is a functional block diagram of an exemplary wireless communication system.

FIG. 2 is a functional block diagram of components of an exemplary configuration of a wireless communication device of the system.

FIG. 4 is a timing diagram illustrating exemplary operational aspects of the circuitry of FIG. 3.

FIG. 5 is a schematic representation of another exemplary arrangement of the synchronization circuitry of the device of FIG. 2.

FIG. 6 is a timing diagram illustrating exemplary operational aspects of the circuitry of FIG. 5.

DETAILED DESCRIPTION OF THE PREFERRED EMBODIMENTS

Figure 3:
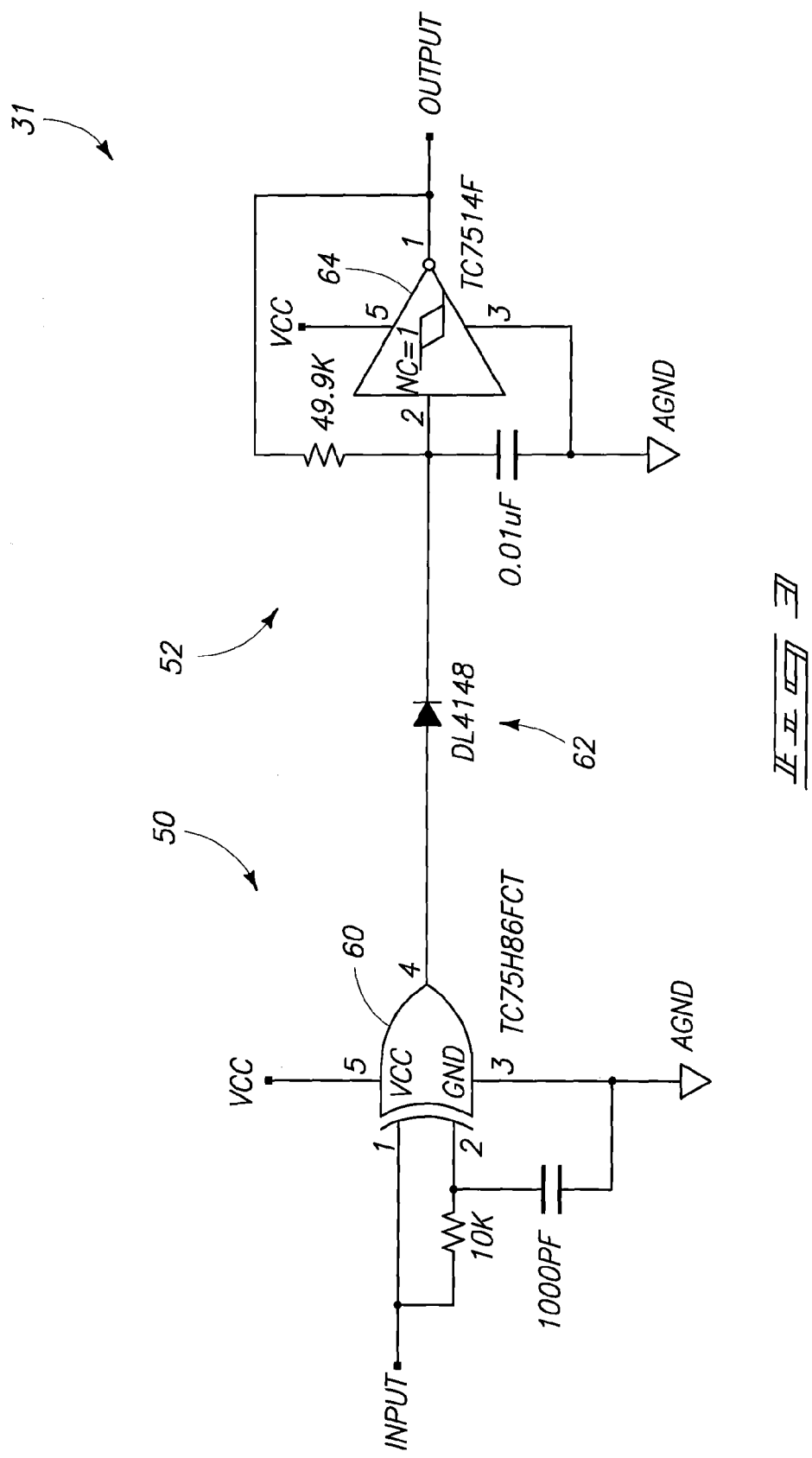
FIG. 3 is a schematic representation of exemplary synchronization circuitry of the device of FIG. 2.

Attention is directed to the following commonly assigned applications, which are incorporated herein by reference:

U.S. Patent Application entitled "Radio Frequency Identification Device Communication Systems, Wireless Communication Devices, Backscatter Communication Methods and Radio Frequency Identification Device Communication Methods" by inventors Mike A. Hughes and Richard M. Pratt having U.S. patent application Ser. No. 10/263,826, filed Oct. 2, 2002, now abandoned; U.S. Patent Application, entitled "Method of Simultaneously Reading Multiple Radio Frequency Tags, RF Tag, and RF Reader", by inventors Emre Ertin, Richard M. Pratt, Mike A. Hughes, Kevin L. Priddy, and Wayne M. Lechelt, having U.S. patent application Ser. No. 10/263,809, filed Oct. 2, 2002, now U.S. Pat. No. 6,995,655; U.S. Patent Application, entitled "RFID System and Method Tag ID Compression", by inventors Richard M. Pratt and Mike A. Hughes, having U.S. patent application Ser. No. 10/263,873, filed Oct. 2, 2002, now U.S. Pat. No. 7,009,526; U.S. Patent Application, entitled "System and Method to Identify Multiple RFID Tags", by inventors Mike A. Hughes and Richard M. Pratt, having U.S. patent application Ser. No. 10/264,078, filed Oct. 2, 2002, now U.S. Pat. No. 7,009,495; U.S. Patent Application, entitled "Radio Frequency Identification Devices, Backscatter Communication Device Wake-Up Methods, Communication Device Wake-Up Methods And A Radio Frequency Identification Device Wake-Up Method", by inventors Richard Pratt and Mike Hughes, having U.S. patent application Ser. No. 10/263,940, filed Oct. 2, 2002, now U.S. Pat. No. 7,019,617; U.S. Patent Application, entitled "Wireless Communication Systems, Radio Frequency Identification Devices, Methods Of Enhancing A Communications Range Of A Radio Frequency Identification Device, And Wireless Communication Methods", by inventors Richard Pratt and Steven B. Thompson, having U.S. patent application Ser. No. 10/263,997, filed Oct. 2, 2002, now U.S. Pat. No. 6,914,528; U.S. Patent Application, entitled "Wireless Communications Systems, Radio Frequency Identification Devices, Wireless Communications Methods, and Radio Frequency Identification Device Communications Methods", by inventors Richard Pratt and Steven B. Thompson, having U.S. patent application Ser. No. 10/263,656, filed Oct. 2, 2002, now U.S. Pat. No. 7,019,618; U.S. Patent Application, entitled "A Challenged-Based Tag Authentication Model", by inventors Mike A. Hughes and Richard M. Pratt, having U.S. patent application Ser. No. 10/263,635, filed Oct. 4, 2002, now U.S. Pat. No. 6,842,106; U.S. patent application Ser. No. 09/589,001, filed Jun. 6, 2000, entitled "Remote Communication System and Method", by inventors R. W. Gilbert, G. A. Anderson, K. D. Steele, and C. L. Carrender; U.S. patent application Ser. No. 09/802,408; filed Mar. 9, 2001, entitled "Multi-Level RF Identification System"; by inventors R. W. Gilbert, G. A. Anderson, and K. D. Steele, now U.S. Pat. No. 6,765,476; U.S. patent application Ser. No. 09/833,465, filed Apr. 11, 2001, entitled "System and Method for Controlling Remote Device", by inventors C. L. Carrender, R. W. Gilbert, J. W. Scott, and D. Clark, now U.S. Pat. No. 6,995,652; U.S. patent application Ser. No. 09/588,997, filed Jun. 6, 2000, entitled "Phase Modulation in RF Tag", by inventors R. W. Gilbert and C. L. Carrender, now abandoned; U.S. patent application Ser. No. 09/589,000, filed Jun. 6, 2000, entitled "Multi-Frequency Communication System and Method", by inventors R. W. Gilbert and C. L. Carrender, now U.S. Pat. No. 6,745,008; U.S. patent application Ser. No. 09/588,998; filed Jun. 6, 2000, entitled "Distance/Ranging by Determination of RF Phase Delta", by inventor C. L. Carrender, now U.S. Pat. No. 6,868,073; U.S. patent application Ser. No. 09/797,539, filed Feb. 28, 2001, entitled "Antenna Matching Circuit", by inventor C. L. Carrender, now U.S. Pat. No. 6,738,025; U.S. patent application Ser. No. 09/833,391, filed Apr. 11, 2001, entitled "Frequency Hopping RFID Reader", by inventor C. L. Carrender, now U.S. Pat. No. 7,009,515.

According to one aspect of the invention, a wireless communication device comprises an antenna configured to receive electromagnetic energy corresponding to a wireless communication signal outputted using an interrogator and to output electrical energy corresponding to the received electromagnetic energy, communication circuitry coupled with the antenna and configured to sample the electrical energy to process the wireless communication signal, synchronization circuitry coupled with the antenna and the communication circuitry and configured to generate a clock signal to control sampling of the electrical energy using the communication circuitry, wherein the synchronization circuitry is configured to generate a plurality of transitions within the clock signal responsive to a plurality of transitions of the electrical energy during a first data period and wherein the synchronization circuitry is configured to generate a plurality of transitions within the clock signal during a second data period including generating at least one of the transitions independent of transitions of the electrical energy.

According to another aspect of the invention, a wireless communication device comprises an antenna configured to receive a wireless communication signal comprising encoded data in a biphase format having one transition for a first digital value and a plurality of transitions for a second digital value, communication circuitry configured to sample the encoded data, an edge detector configured to generate a plurality of pulses responsive to the transitions of the encoded data and an oscillator coupled with the edge detector and configured to output a signal responsive to the pulses to control sampling of the encoded data using the communication circuitry.

According to another aspect of the invention, a method of processing a wireless communication signal comprises providing a radio frequency identification device, receiving a data signal including a plurality of digital values within the radio frequency identification device, sampling the data signal at a plurality of moments in time during individual ones of the digital values using the radio frequency identification device and wherein the sampling at one moment in time comprises sampling responsive to a transition in the data signal and the sampling at another moment in time comprises sampling after the elapse of a period of time without a transition in the data signal.

According to another aspect of the invention, a wireless communication synchronization method comprises receiving a data signal, generating a plurality of edge pulses corresponding to the data signal, generating a plurality of level transitions within a clock signal responsive to a time constant during a first digital value of the data signal and responsive to the edge pulses during a second digital value of the data signal and sampling the data signal using the clock signal.

According to yet another aspect of the invention, a radio frequency identification device communication method comprises providing a radio frequency identification device including an oscillator, receiving a data signal having a plurality of transitions within the radio frequency identification device, and wherein the data signal includes digital data encoded according to a data encoding format including one of a biphase mark format and a biphase space format, generating a plurality of edge pulses corresponding to the transitions of the data signal, generating a clock signal having a plurality of transitions using the oscillator, generating the transitions of the clock signal using the edge pulses during a first digital value of the data signal, generating at least one of the transitions of the clock signal using a time constant of the oscillator and independent of the edge pulses during a second digital value of the data signal, sampling the data signal using the clock signal, and backscatter modulating a continuous wave signal after the sampling to formulate a reply communication to the received data signal.

Referring to FIG. 1, an exemplary wireless communication system 10 is depicted. The exemplary system 10 includes a first communication device 12 and one or more second communication device 14. Only one device 14 is shown in the exemplary arrangement of FIG. 1. In other arrangements, a plurality of devices 14 may be utilized for communications with device 12.

First and second communication devices 12, 14 are arranged to implement wireless communications 16 in the depicted exemplary embodiment. Possible wireless communications 16 include first wireless communication signals 18 communicated from first communication device 12 and second wireless communication signals 20 communicated from the one or more second communication device 14. Wireless communication signals include signals (e.g., electromagnetic) which at some point in time are communicated over a wireless medium but may also be communicated over an electrical conductor (e.g., electrical signals within devices 12, 14) at other moments in time. Wireless communication signals 18, 20 may also be referred to as data signals including encoded digital information or data to be communicated intermediate devices 12, 14.

System 10 is provided to illustrate exemplary structural aspects and methodology aspects of the present invention. In one possible implementation, system 10 is implemented as a radio frequency identification device (RFID) communications system. For example, in such an arrangement, first communication device 12 may be implemented as a reader, and second communication devices 14 may be referred to as remote communication devices and may be implemented as transponders, such as RFID tags. In such an implementation, devices 14 may be associated with respective articles (not shown) to implement identification operations.

In one configuration, first wireless communication signals 18 may be referred to as forward link wireless signals and second wireless communication signals 20 may be referred to as return link wireless signals communicated responsive to forward link wireless signals 18. Exemplary wireless communications 16 include electromagnetic energy or signals, such as radio frequency signals. Alternatively, wireless communications 16 may comprise infrared signals, acoustic signals, or any other appropriate signals capable of being communicated between devices 12, 14.

Referring to FIG. 2, an exemplary arrangement of communication device 14 is shown. The depicted device 14 includes an antenna 30, synchronization circuitry 31, communication circuitry 32, and an energy source 36.

Antenna 30 is arranged to receive electromagnetic energy of signals 18 and to output electromagnetic energy of signals 20. Antenna 30 may comprise a single antenna for communication of signals 18, 20, or include a plurality of respective dedicated antennas for communication of signals 18, 20.

Synchronization circuitry 31 operates to implement synchronization operations according to aspects of the present invention. As discussed in detail herein, synchronization circuitry 31 operates to synchronize device 14 with communication signals 18 from device 12. In one arrangement, synchronization circuitry 31 is arranged to provide a signal, such as a clock signal, to communication circuitry 32 to control sampling of received communication signals 18. Synchronization circuitry 31 may be implemented using discrete components, an Application Specific Integrated Circuit (ASIC), or other configurations.

Communication circuitry 32 includes processing circuitry 37 according to at least one configuration. Exemplary processing circuitry 37 includes a processor 38 which may be implemented as a model number MSP430F1121 available from Texas Instruments, Inc. Other processing circuitry and processor configurations are possible. Some operations of communication circuitry 32 are discussed in a U.S. patent application entitled "Radio Frequency Identification Devices, Backscatter Communication Device Wake-up Methods, Communication Device Wake-Up Methods, and A Radio Frequency Identification Device Wake-up Method," naming Richard Pratt and Mike Hughes as inventors, Ser. No. 10/263,940 filed the same day as the present application, and incorporated herein by reference. In general, communication circuitry 32 is configured to sample and process received wireless communication signals 18 and to formulate and communicate communication signals 20.

Energy source 36 may comprise one of a plurality of possible configurations corresponding to the implementation of communication device 14. For example, communication device 14 may be implemented in passive, semi-passive or active configurations in exemplary arrangements.

In semi-passive implementations, energy source 36 may comprise a battery utilized to provide electrical energy to communication circuitry 32 to implement processing of wireless communication signals 18 while electromagnetic energy received within device 14 is utilized to generate wireless communication signals 20.

For active implementations, energy source 36 may also comprise a battery arranged to provide operational electrical energy to communication circuitry 32 similar to the described semi-passive implementation. In addition, energy source 36 comprising a battery may also be utilized to generate radio frequency energy for communication of signals 20.

For passive implementations of device 14, received electromagnetic energy (e.g., radio frequency energy) is utilized to provide operational electrical energy, to communication circuitry 32 of device 14, as well as provide radio frequency energy for communication of wireless signals 20. In such an implementation, energy source 36 may comprise a power antenna and discrete components arranged to convert received electromagnetic energy into usable operational electrical energy.

Processor 38 of communication circuitry 32 is configured to execute instructions to control communication operations of device 14. For example, processor 38 of communication circuitry 32 is arranged to sample and to process received wireless communication signals 18 and to control communication of outputted wireless communication signals 20. Processor 38 may utilize signals from synchronization circuitry 31 to implement sampling of received wireless communication signals 18 at appropriate moments in time. Exemplary synchronization operations are discussed in detail below with reference to FIGS. 3-6.

For communicating information, processor 38 is configured to control antenna 30 to generate wireless communication signals 20 using backscatter modulation communication techniques in one possible exemplary arrangement. Communication circuitry 32 may control outputting of wireless communication signals 20 using backscatter modulation according to at least one radio frequency identification device communications protocol. In such an arrangement, wireless communication signals 20 are generated by backscatter modulating electromagnetic energy present at device 14. The electromagnetic energy which is backscatter modulated may be generated by device 12 (e.g., a continuous wave signal outputted from device 12, communications from device 12 to other devices 14, etc.) or by other sources.

Communication circuitry 32 controls electrical characteristics of antenna 30 according to one backscatter embodiment. Processor 38 may provide a modulation signal to alter electrical characteristics of antenna 30 wherein electromagnetic energy is selectively reflected by antenna 30. Antenna 30 selectively reflects electromagnetic energy creating wireless communication signals 20 responsive to the modulation signal according to one exemplary backscatter implementation.

The modulation signal may be encoded with information to be communicated from device 14 to device 12. Exemplary information includes identification information, such as a unique serial number which identifies the communicating device 14, or any other desired information to be communicated. According to one exemplary arrangement, communication devices 12, 14 are configured to communicate wireless signals 18, 20 using on/off key (OOK) modulation, such as a biphase space (FM0) or biphase mark (FM1) encoding schemes. Other types of modulation or schemes may be utilized to communicate information between devices 12, 14.

Communication circuitry 32 arranged to implement RFID communications may be referred to as radio frequency identification device communication circuitry. Communication circuitry 32 may be operable to control communication of wireless communication signals 20 responsive to processing of one or more wireless communication signal 18. For example, circuitry 32 may implement transponder communications in one exemplary embodiment.

Processing of received signals 18 may include extracting an identifier from the wireless communication signals 18 (e.g., an identifier of the communicating device 12 and/or identifying device 14) and also include processing of commands within signals 18. Device 14 may selectively output or communicate wireless communication signals 20 including identification information or other desired requested information from first communication device 12.

Synchronization of device 14 with device 12 is desired for proper wireless communications. As mentioned above, wireless communication signals 18 may encode digital data using a biphase format. Some aspects of the invention utilize biphase mark (FM1) and/or biphase space (FM0) formats for encoding digital data upon communication signals 18, 20. Biphase mark and space formats individually provide a level transition at a leading edge of each bit of digital data. A second transition occurs at the center of the bit for a binary 1 for biphase mark encoding and a binary 0 for biphase space encoding. Otherwise, no second transition occurs at the center of the bit for a binary 0 for biphase mark encoding and a binary 1 for biphase space encoding. Accordingly, one digital value of the data signal has a single transition and another digital value of the data signal has a plurality of transitions using biphase mark or space encoding.

Manchester encoding provides transitions at the beginning of each bit and also provides transitions midway through each bit with the direction of the transition indicating the value of the bit. Phase inversions of a carrier cause data polarity to invert and Manchester data 0s become 1s and 1s become 0s if a distance from device 12 to device 14 changes more than a small portion of the wavelength of the carrier. Biphase mark and biphase space are insensitive to such phase inversions.

Biphase encoding provides serial data streams having clock and data information within a single waveform. Biphase formats conveniently provide an efficient description when one bit ends and another bit begins such that the data stream can be decoded.

Synchronization circuitry 31 in accordance with one aspect of the present invention determines when a serial data stream of signal 18 should be sampled to decode digital data within the communicated signal 18. An example of such circuitry configured to provide a clock signal for indicating when sampling is appropriate is depicted in FIG. 3. According to other aspects, synchronization circuitry may extract and provide a clock signal for indicating appropriate sampling times. An example of such circuitry according to the other aspects is depicted in FIG. 5 as reference 31a.

Referring to FIG. 3, details of exemplary synchronization circuitry 31 are described. The depicted synchronization circuitry 31 includes an edge detector 50 coupled with an oscillator 52. The input of synchronization circuitry 31 may be coupled with antenna 30 and the output may be coupled with communication circuitry 32. For example, the output of circuitry 31 may be coupled with pin 9 (e.g., P2.1/INCLK in the described configuration) of processor 38. Synchronization circuitry 31 is configured to provide a clock signal to control proper sampling of received signals within communication circuitry 32 to decode such signals.

Operations of synchronization circuitry 31 of FIG. 3 are described with reference to the timing diagram of FIG. 4. FIG. 4 includes a plurality of timing lines 54, 56, 58. Line 54 is a data signal received using antenna 30 and comprises biphase space (FM0) encoded data in the exemplary configuration. Circuitry 31 may be utilized to provide synchronization with biphase mark data or data encoded according to other encoding schemes. Line 56 corresponds to an output of edge detector 50. Line 58 corresponds to an output of oscillator 52 and is a clock signal whose rising edge determines sample times for decoding the data signal.

Signal transitions within the received input data signal (line 54) corresponding to encoded data are converted to a plurality of pulses by edge detector 50 as illustrated in line 56. A pulse width of the edges is determined by a resistor (e.g., 10 kOhms) and a capacitor (e.g., 1,000 pF) coupled with an exclusive OR logic device 60 of edge detector 50.

Oscillator 52 coupled with edge detector 50 is arranged to output a clock signal responsive to received pulses to control sampling of encoded data using the communication circuitry 32. In the absence of pulses from edge detector 50 (i.e., indicating an absence of transitions in a data signal), a diode 62 electrically isolates oscillator 52 from edge detector 50 and allows oscillator 52 to toggle at a frequency according to a time constant set by a resistor (e.g., 49.9 kOhms) and a capacitor (e.g., 0.01 uF) coupled with an inverter 64 of oscillator 52. The output of inverter 64 is the opposite state of its input. Accordingly, when the inverter input is low, current will flow from the inverter output to charge the associated capacitor. Such causes the voltage at the inverter input to increase until a threshold voltage is reached causing the output to go low. Current now flows from the capacitor through the respective resistor to the inverter output until a threshold voltage in the inverter is reached to cause the output to go high. Such process toggles at a frequency set by the respective resistor and capacitor and operates to form oscillator 52.

The waveform of line 54 shown in FIG. 4 depicts FM0 encoded information having a data rate which is set by the duration of individual bits to be communicated corresponding to respective data or bit periods 70. A rising edge within line 58 corresponding to an output of oscillator 52 provides timing information for decoding input data of signal 54 within communication circuitry 32. In the exemplary configuration, the clock signal from synchronization circuitry 31 enables sampling of the data signal at a plurality of different times during individual bit periods 70 corresponding to individual digital values. Providing plural samplings during a single bit period 70 enables decoding to indicate whether a sampled bit encoded using biphase mark or space formats is a 1 or 0 (e.g., circuitry 32 is controlled via signal 58 to sample the data signal during a first half of period 70 and a second half of period 70 to determine whether the level of the data signal changed which indicates the value of the bit).

For proper decoding operations of FM0, for example, the oscillator frequency should be set so that one rising edge of the clock signal occurs during each state of a 0 bit and two rising edges occur during a constant state of a 1 bit. For biphase encoded signals, the clock signal controls sampling of a plurality of different states of the data signal during one bit period for one digital value of the data, and sampling of the data signal having the same state at a plurality of different times during one bit period for another digital value.

Referring to FIGS. 3 and 4, edge pulses outputted from edge detector 50 as indicated by line 56 operate to drive the output of oscillator 52 low aligning the output of oscillator 52 with received data. In the illustrated FM0 implementation, plural edge pulses are provided by edge detector 50 during each 0 bit period 70 and a single pulse is generated during each 1 bit period 70.

Oscillator 52 is provided with a time constant to provide generation of a plurality of pulses or transitions (e.g., four) of the clock signal during individual bit periods 70 as illustrated in line 58. The oscillation frequency of oscillator 52 may be selected to be substantially twice a data rate of encoded data received within wireless communications signals 18 in the exemplary configuration of FIG. 3. Synchronization circuitry 31 shown in FIG. 3 is arranged to generate transitions of the clock signal indicated by line 58 responsive to transitions of data (e.g., individual edge pulses drive line 58 low) at a first moment in time (e.g., corresponding to the bit period 70 of a 0 bit within received FM0 data). For a second moment in time (e.g., corresponding to the bit period 70 of a 1 bit within received FM0 data) synchronization circuitry 31 is arranged to generate one transition in line 58 responsive to an edge pulse from detector 50 and a second pulse independent of edge pulses from detector 50 (i.e., only one edge pulse is provided during bit periods 70 of 1 bits of FM0 data) and responsive to the time constant of oscillator 52.

Biphase mark data and biphase space data may be thought of as individually including a plurality of frequencies corresponding to respective different bit values. For the illustrative FM0 data line using biphase encoding, 0 bits have an increased frequency compared to 1 bits. Synchronization circuitry 31 shown in FIG. 3 is configured to generate transitions of the clock signal responsive to transitions of the input data having a frequency less than a time constant of the oscillator 52 of synchronization circuitry 31 (e.g., during an FM0 0 bit) and to generate at least one transition of the clock signal (e.g., a second clock signal transition during an FM0 1 bit) responsive to the time constant when a frequency of the transitions within the data signal is greater than the time constant.

Sampling provided using the exemplary synchronization circuitry 31 of FIG. 3 at one moment in time (e.g., during FM0 0 digital values) is responsive to a plurality of transitions in the data signal. At least some sampling at another moment in time (e.g., during reception of FM0 1 digital values) is provided after the elapse of a period of time (e.g., time constant of oscillator 52 in the described exemplary configuration) without a transition in the data signal or pulse from detector 50. The outputted clock signal in the described exemplary aspect is outputted using oscillator 52 having an oscillation frequency greater than a data rate of the received data signal in the described embodiment.

Another possible exemplary arrangement of synchronization circuitry is illustrated in FIG. 5 with respect to reference numeral 31a. Like references herein may refer to like components with any significant differences therebetween being represented by a suffix, such as "a". Exemplary operations of synchronization circuitry 31a are described with reference to lines 90, 92, 94, 96 of FIG. 6.

Circuitry 31a includes an edge detector 50, an oscillator 52a, an inverter 80 and a flip-flop 82. Line 90 corresponds to a received data signal corresponding to received wireless communication signals 18. Line 92 corresponds to an output of edge detector 50. Line 94 corresponds to an output of oscillator 52a Line 96 corresponds to a clock signal outputted from flip-flop 82. The input of the synchronization circuitry 31a may be coupled with antenna 30 and the output may be coupled with pin 9 of processor 38 of communication circuitry 32 in the described exemplary embodiment.

Synchronization circuitry 31a is an exemplary hardware solution to extract and provide a clock signal represented by line 96. The exemplary configuration is described with reference to biphase space (FM0) input data of line 90. Circuitry 31a may be utilized with biphase mark data or data encoded according to other encoding schemes.

Line 92 represents an output of edge detector 50. When FM0 1 digital values are received, there is no pulse in the middle of the data or bit period 70.

Oscillator 52a has a resistor 82 kOhms and a capacitor of 0.01 uF to provide an oscillation frequency near the data rate of the incoming data (e.g., approximately 4 kHz in the presently described configuration). For individual edges from edge detector 50, the voltage on the capacitor of oscillator 52a is forced high and the oscillator output is forced low. Current flows through the respective resistor to the oscillator output until the voltage on respective capacitor is below the inverter threshold and the output goes high. Accordingly, the oscillator period and the edge pulses set the oscillator output low.

Flip-flop 82 is arranged to output the clock signal represented by line 96. Signals from edge detector 50 provide toggling of flip-flop 82. Flip-flop 82 is clocked by the output of edge detector 50 represented by line 92. The output of oscillator 52a is provided to clear flip-flop 82. In the described arrangement, the signal outputted from oscillator 52a is inverted and AC coupled to the clear line of flip-flop 82. The inverted signal provides adjustment of rising edges of the clock signal represented by line 96 to the beginning of data or bit periods 70 of the encoded data In the absence of encoded data within the received data signal, oscillator 52a continues to clock at its base frequency but the output of flip-flop 82 comprising the clock signal is set to a predefined digital value, such as a binary low. Rising edges of the clock signal provide sampling times of the data. In the exemplary arrangement, the output of oscillator 52a is only high at a clock edge time during an FM0 digital value 1 for biphase space encoded data.

Referring to FIGS. 5 and 6, the output of edge detector 50 (line 92) going high forces the output of oscillator 52a low to re-synchronize oscillator, 52a. If the respective resistor and capacitor of oscillator 52a are sufficiently large, the output of oscillator 52a is set to go high during predefined digital values (e.g., a digital value 1 for FM0 data). A digital value 1 for FM0 data synchronizes the outputted clock signal represented by line 96 with incoming data.

The arrangement of synchronization circuitry 31a depicted in FIG. 5 may be implemented using an ASIC wherein the resistor and/or capacitor of oscillator 52a may be external to the ASIC to provide flexibility in adjusting the frequency or time constant of oscillator 52a. The provision of the synchronization circuitry 31a within an ASIC reduces consumption of electrical energy by processor 38 from energy source 36, such as a battery.

Synchronization circuits 31, 31a described herein provide advantages over phase lock loops or over-sampling techniques using a microprocessor inasmuch as power is conserved. Aspects of the invention enable synchronization of a clock frequency of device 14 with a clock frequency of device 12. The capacitor and resistor values of the respective oscillators 52, 52a may be modified to change the capture range of the respective oscillators corresponding to data rates of received data. Aspects of the present invention provide synchronization of two non-symmetric periodic waveforms if the waveforms are within a relatively narrow frequency range of one another (e.g., 2 kHz for an exemplary FM0 data rate of 10 kHz) including one waveform from device 12 and the second waveform originating within device 14 generated using an oscillator in exemplary configurations.

As described above for the exemplary synchronization circuits 31, 31a, edge detectors 50 operate to correct oscillation frequencies of respective oscillators 52, 52a. Individual edge detectors 50 operate to convert encoded data signals into pulse trains corresponding to transitions within the received data. Input of edge detector 50 includes the encoded data and a time-delayed signal of the encoded data. Transitions within the encoded data create positive-going pulses. Diode 62 couples edge detector 50 to the input of the respective oscillator 52, 52a forcing the oscillator output low for each transition on the incoming encoded data. Diode 62 isolates a respective oscillator 52, 52a from edge detector 50 except when the edge detector output is high.

Synchronization circuitry described according to aspects of the invention may be utilized in exemplary applications to provide biphase mark and space decoding in low power environments. Test data with FM0 data rates of 10 kHz showed that the resistor and capacitor sizes of edge detector 50 were not significantly important and provided a data bit capture range of +/−2 kHz. Changing a resistor of the oscillators 52, 52a is adequate for setting the oscillator frequency over a significant frequency range. Accordingly, the described synchronization circuitry 31, 31a may be individually implemented within an ASIC utilizing a single external oscillator resistor enabling use over a relatively large frequency range.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of processing a wireless communication signal comprising:
    providing a radio frequency identification device;
    receiving a data signal including a plurality of digital values within the radio frequency identification device;
    using the radio frequency identification device, sampling the data signal at a plurality of moments in time during each of the digital values; and
    wherein the sampling at one moment in time comprises sampling as a result of a transition in the data signal and the sampling at another moment in time comprises sampling after the elapse of a predetermined period of time without a transition in the data signal.

2. The method of claim 1 wherein the received data signal comprises digital data encoded according to one of a biphase mark format and a biphase space format.

3. The method of claim 1 wherein the sampling at the one moment in time includes sampling as a result of the transition in the data signal occurring prior to the elapse of the period of time dictated by a time constant.

4. The method of claim 1 wherein the sampling at the another moment in time comprises sampling after the elapse of the period of time corresponding to a time constant.

5. The method of claim 1 wherein the sampling the data signal at the moments in time comprises sampling as a result of a clock signal, and wherein the clock signal has a predefined digital value in the absence of encoded data within the data signal.

6. The method of claim 1 wherein the sampling the data signal at the moments in time comprises sampling one of the digital values of the data signal during plural different states of the data signal and sampling another of the digital values of the data signal during a same state of the data signal at plural ones of the moments in time.

7. The method of claim 1 further comprising, using the radio frequency identification device, outputting an identification signal which identifies the radio frequency identification device to implement radio frequency identification device communications.

8. The method of claim 1 wherein the data signal comprises an identifier of the radio frequency identification device, and further comprising:
    processing the identifier; and
    using the radio frequency identification device, implementing an operation as a result of the processing indicating that the identifier identifies the radio frequency identification device.

9. A wireless communication synchronization method comprising:
    receiving a data signal;
    first generating a plurality of edge pulses corresponding to the data signal;
    second generating a plurality of transitions within a clock signal as a result of a plurality of edge pulses during a first digital value of the data signal;
    third generating a plurality of transitions within the clock signal during a second digital value of the data signal including generating at least one of the transitions independent of the edge pulses during the second digital value of the data signal; and
    sampling the data signal using the clock signal.

10. The method of claim 9 wherein the received data signal is encoded with digital data according to one of a biphase mark and a biphase space format.

11. The method of claim 9 further comprising generating the clock signal having a frequency greater than a data rate of the data signal.

12. The method of claim 9 further comprising generating the clock signal having a frequency at least twice a data rate of the data signal.

13. The method of claim 9 further comprising generating the clock signal having a frequency which is an integer multiple of a data rate of the data signal.

14. The method of claim 9 further comprising outputting the clock signal to communication circuitry using a flip-flop.

15. The method of claim 14 wherein the third generating transitions during the second digital value comprises selectively clearing the flip-flop using an oscillator having an oscillation frequency substantially equal to a data rate of the data signal.

16. The method of claim 15 wherein the second generating transitions during the first digital value comprises toggling the flip-flop at an increased frequency compared with toggling the flip-flop according to the oscillation frequency.

17. The method of claim 9 further comprising outputting the clock signal having a predefined digital value during an absence of digital data within the data signal.

18. The method of claim 9 wherein the sampling comprises sampling the data signal a plurality of times during a data period of the data signal.

19. The method of claim 9 wherein the receiving the data signal comprises receiving the data signal within a radio frequency identification device.

20. The method of claim 9 further comprising, using the clock signal, controlling the sampling during a plurality of different states of the data signal during one digital value and a plurality of times during a same state of the data signal during another digital value.

21. The method of claim 9 wherein the first generating the plurality of edge pulses comprises generating using an edge generator as a result of transitions in the data signal, and the second and third generatings of the transitions in the clock signal each comprise generating using an oscillator, and further comprising electrically isolating the edge generator and the oscillator during an absence of the transitions in the data signal.

22. The method of claim 9 further comprising outputting the clock signal having a predefined value during an absence of encoded data in the data signal.

23. The method of claim 9 wherein the second generating the transitions within the clock signal as a result of the edge pulses comprises generating the transitions corresponding to the pulses.

24. The method of claim 9 wherein the second generating the transitions within the clock signal as a result of the edge pulses comprises generating the transitions at substantially the same moments in time as the pulses.

25. The method of claim 9 wherein the first generating the edge pulses comprises generating the edge pulses as a result of transitions in the data signal, and the sampling comprises sampling the data signal comprising the transitions which directly correspond to encoded data of the data signal.

26. A radio frequency identification device communication method comprising:
    receiving a data signal within a radio frequency identification device, and wherein the data signal includes a plurality of transitions corresponding to digital data encoded according to a data encoding format including one of a biphase mark format and a biphase space format;

generating a plurality of edge pulses corresponding to the transitions of the data signal;

generating a clock signal having a plurality of transitions using an oscillator of the radio frequency identification device;

generating the transitions of the clock signal using the edge pulses during a first digital value of the data signal;

generating at least one of the transitions of the clock signal using a time constant of the oscillator and independent of the edge pulses during a second digital value of the data signal;

sampling the data signal using the clock signal; and backscatter modulating a continuous wave signal after the sampling to formulate a reply communication to the received data signal.

* * * * *

UNITED STATES PATENT AND TRADEMARK OFFICE
CERTIFICATE OF CORRECTION

PATENT NO. : 8,218,703 B2  
APPLICATION NO. : 12/630764  
DATED : July 10, 2012  
INVENTOR(S) : Richard M. Pratt and Steven B. Thompson It is certified that error appears in the above-identified patent and that said Letters Patent is hereby corrected as shown below:

On the title page:

(73) Assignee – Replace "Battelle Memorial Institute, Richmond, WA (US)" with --Battelle Memorial Institute, Richland, WA (US)--

Signed and Sealed this  
Twelfth Day of March, 2013

Teresa Stanek Rea  
*Acting Director of the United States Patent and Trademark Office*